United States Patent
Cai (10) Patent No.: US 10,319,755 B2
(45) Date of Patent: Jun. 11, 2019

(54) MANUFACTURING METHODS OF THIN FILM TRANSISTORS AND MANUFACTURING METHODS OF ARRAY SUBSTRATES

(71) Applicant: Shenzhen China Star Optoelectronics Technology Co. Ltd., Shenzhen, Guangdong (CN)

(72) Inventor: Xiaolong Cai, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 136 days.

(21) Appl. No.: 15/520,393

(22) PCT Filed: Apr. 13, 2017

(86) PCT No.: PCT/CN2017/080406
§ 371 (c)(1),
(2) Date: Apr. 19, 2017

(87) PCT Pub. No.: WO2018/166024
PCT Pub. Date: Sep. 20, 2018

(65) Prior Publication Data
US 2018/0301481 A1    Oct. 18, 2018

(51) Int. Cl.
*H01L 21/00* (2006.01)
*H01L 27/12* (2006.01)
*G03F 7/00* (2006.01)
*H01L 29/786* (2006.01)
*H01L 21/28* (2006.01)
*H01L 29/66* (2006.01)

(52) U.S. Cl.
CPC ........ *H01L 27/1288* (2013.01); *G03F 7/0002* (2013.01); *H01L 21/28008* (2013.01); *H01L 27/127* (2013.01); *H01L 27/1214* (2013.01); *H01L 27/1225* (2013.01); *H01L 27/1259* (2013.01); *H01L 29/66742* (2013.01); *H01L 29/786* (2013.01); *H01L 29/78693* (2013.01)

(58) Field of Classification Search
CPC .......... H01L 27/1288; H01L 21/28008; H01L 27/1214; H01L 27/1225; H01L 27/1259; H01L 27/127; H01L 29/66742; H01L 29/786; H01L 29/78693
See application file for complete search history.

(56) References Cited

U.S. PATENT DOCUMENTS

| 6,387,822 | B1 * | 5/2002 | Murphy | G03F 7/423 216/36 |
| 2008/0166838 | A1 * | 7/2008 | Long | H01L 27/124 438/151 |

FOREIGN PATENT DOCUMENTS

CN    104617042 A    5/2015

\* cited by examiner

*Primary Examiner* — Richard A Booth
(74) *Attorney, Agent, or Firm* — Andrew C. Cheng (57) ABSTRACT

The present disclosure relates to a manufacturing method of thin film transistors (TFTs) and a manufacturing method of array substrates. The manufacturing method includes: forming transfer layers interleaved with each other on a substrate; forming a metal layer on the transfer layer, wherein the metal layer covers the substrate; conducting a deionization (DIW) stripping process to peel off the transfer layer and the metal layer from the substrate, and preserving the metal layer, wherein the metal layer is arranged out of the top of the transfer layer, on the substrate to form a metal electrode of the TFT.

15 Claims, 9 Drawing Sheets

MANUFACTURING METHODS OF THIN FILM TRANSISTORS AND MANUFACTURING METHODS OF ARRAY SUBSTRATES

BACKGROUND OF THE INVENTION

1. Field of the Invention

The present disclosure relates to display technology field, and more particularly to a manufacturing method of thin film transistors (TFTs) and a manufacturing method of array substrates.

2. Discussion of the Related Art

With the evolution of the technology, people increasingly dependent on the information storage, information transmission and information operation. Due to the semiconductor devices are the main carrier and basis of information storage, information transmission, and information operation, the semiconductor devices have become a hot spot for scientists to study. The TFT is an important semiconductor device and has been widely adopted. However, the metal electrode of the conventional TFT is obtained by many manufacturing process, such as the photoresist process, the exposure process, the develop process, and the etch process. The copper ion aggregation during the etch process may cause a higher risk of overheating and explosion, and may reduce the TFT electrical performance The etching solution, the transfer stripper solution in the pattern, and the waste disposal of both solution may lead to higher costs.

SUMMARY

The present disclosure relates to a manufacturing method of TFTs and a manufacturing method of array substrates. As such the copper ion aggregation in etching solution during the etch process in a conventional manufacturing process of forming the metal electrode may be avoided, so as to reduce risk of overheating and explosion, and may improve the TFT electrical performance The etching solution, the transfer stripper solution in the pattern, and the waste disposal of both solution may be omitted to reduce the costs.

In one aspect, the manufacturing method of TFTs includes: forming a transfer layer on a substrate, wherein the transfer layer covers the whole surface of the substrate; conducting a Nano-imprinting process on the whole surface of the transfer layer to form a first transfer layer, wherein the substrate is divided into a first area and a second area along a direction parallel to the substrate, and the first area and the second area are interleaved with each other, and the first transfer layer is configured within the first area; forming a first metal layer within the first area and the second area; conducting a deionization (DIW) stripping process to peel off the first transfer layer and the first metal layer within the first area from the substrate, and preserving the first metal layer within the second area on the substrate to form a gate of the TFT; forming a gate insulation layer on the gate; forming a semiconductor layer on a top of the gate within the gate insulation layer; forming a second transfer layer, wherein the gate insulation layer is divided into a third area and a fourth area along a direction parallel to the gate insulation layer, and the third area and the fourth area are interleaved with each other; the fourth area comprises a first sub-area, a second sub-area, and a third sub-area arranged along the direction parallel to the gate insulation layer in sequence; the second transfer layer is configured within the third area and the second sub-area; forming a second metal layer within the third area and the fourth area; conducting the DIW stripping process to peel off the second transfer layer and the second metal layer within the third area and the second sub-area from the gate insulation layer, and preserving the second metal layer within the first and third sub-area on the gate insulation layer to respectively form a source and a drain, wherein the source connects with a source contact area of the semiconductor layer, and the drain connects with a drain contact area of the semiconductor layer.

The manufacturing method of array substrates includes: forming a transfer layer on a substrate, wherein the substrate is divided into a first area and a second area along a direction parallel to the substrate, and the first area and the second area are interleaved with each other; the first transfer layer is configured within the first area; forming a metal layer within the first area and the second area; conducting a DIW stripping process to peel off the first transfer layer and the first metal layer within the first area from the substrate, and preserving the first metal layer within the second area on the substrate to form a metal electrode of the TFT.

In view of the above, the transfer layers are formed on the substrate, wherein the transfer layers are interleaved with each other. The metal layer is formed on the substrate, wherein the metal layer covers the substrate. The transfer layer is conducted by the DIW stripping process to peel off the transfer layer and the metal layer from the substrate, and preserving the metal layer, wherein the metal layer is arranged out of a top of the transfer layer, to form an electrode of the TFTs. The metal electrode may be obtained without an etching process. As such the copper ion aggregation in etching solution during the etch process in a conventional manufacturing process of forming the metal electrode may be avoided, so as to reduce risk of overheating and explosion, and may improve the TFT electrical performance The etching solution, the transfer stripper solution in the pattern, and the waste disposal of both solution may be omitted to reduce the costs.

DETAILED DESCRIPTION OF THE EMBODIMENTS

First, transfer layers are formed on a substrate, wherein the transfer layers are interleaved with each other. A metal layer is formed on the substrate, wherein the metal layer covers the substrate. The transfer layer is conducted by a deionization (DIW) stripping process to peel off the transfer layer and the metal layer from the substrate, and preserving the metal layer, wherein the metal layer is arranged out of a top of the transfer layer, to form an electrode of thin film transistors (TFTs). That is, the present disclosure may conduct a TFT metal electrode patterned process via the transfer layer having a predetermined pattern, such that the metal electrode of the TFT may be obtained without a etch process.

In one example, the metal electrode of the TFT may be a gate. In another example, the metal electrode of the TFT may be at least one of a source or a drain. The substrates may be different in accordance with the metal electrodes. For example, if the metal electrode is the gate, the substrate may be a transparent substrate configured to carry the TFT and pixel electrodes. If the metal electrode is a source and/or a drain of a bottom gate type TFT, the substrate may be a gate insulation layer (GI layer) of the TFT. If the metal electrode is a source and/or a drain of a top gate TFT, the substrate may be an interlayer dielectric layer (also referred to as IDL or dielectric layer).

The various embodiments of the present disclosure will now be described in detail with reference to the accompanying drawings. In the case of no conflict, the features of the following embodiments may be combined with each other.

Figure 1:
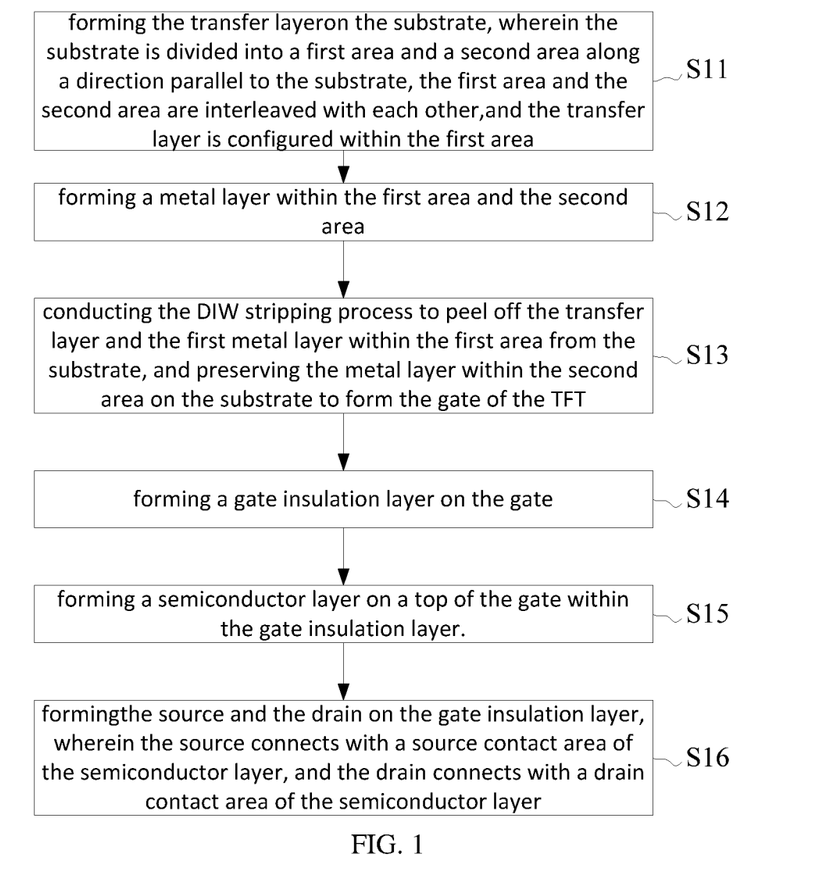
FIG. 1 is a flowchart of a manufacturing method of TFTs in accordance of the first embodiment of the present disclosure.

Refer to FIG. 1, the present disclosure relates to a manufacturing method of TFTs, wherein the manufacturing method includes the following steps.

In step S11: forming the transfer layer on the substrate, wherein the substrate is divided into a first area and a second area along a direction parallel to the substrate, and the first area and the second area are interleaved with each other. The transfer layer is configured within the first area.

In one example, a Nano-imprinting process is adopted to form the transfer layer having the predetermined pattern.

Figure 2:
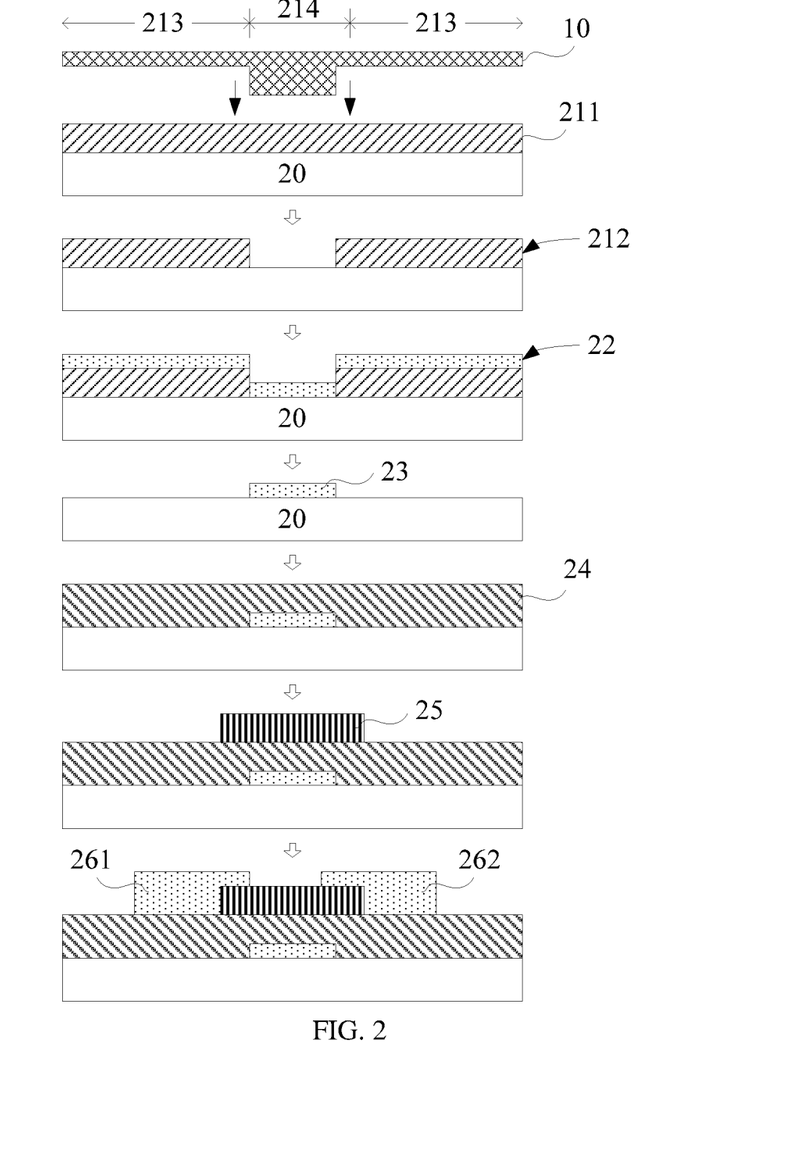
FIG. 2 is a schematic view of the TFT manufactured by the manufacturing method shown in FIG. 1.

As shown in FIG. 2, the transfer layer 211 is formed on the substrate 20, wherein the transfer layer 211 covers the whole surface of the substrate 20. The substrate 20 may be a transparent substrate, such as, but not limited to, glass substrate, plastic substrate, and flexible substrate. In one example, the transfer layer 211 may be formed on the substrate 20 via a coating process, a attaching process, and a physical vapor deposition (PVD) process. The transfer layer 211 may be made of, but not limited to, polyvinyl alcohol (PVA).

The transfer layer 211 is conducted by the Nano-imprinting process to form a transfer layer 212 having a predetermined pattern. In one example, the transfer layer 211 of the substrate 20 is embossed to form the predetermined pattern in proportion via a stencil 10 having a Nano-pattern by mechanical force. In one example, a first area 213 of the transfer layer 211 made of PVA is conducted by a water pressure process to remove the PVA within the first area 213 by controlling the embossing time and the embossing temperature, and the PAV of a second area 214 is preserved to form the transfer layer 212 having the predetermined pattern.

In another example, the transfer layer 212 may be formed by conducting a attaching process on the substrate 20. That is, to adhere the transfer layer 212 having the predetermined pattern directly to the substrate 20.

In step S12: Forming a metal layer within the first area and the second area.

In one example, the PVD process is conducted on the transfer layer 212 to form the metal layer 22. The metal layer may be made of cooper or molybdenum, but not limited to.

The metal layer 22 of the first area 213 is configured within the transfer layer 212. The metal layer 22 of the second area 214 is configured within the substrate 20. A height of the metal layer 22 within the first area 213 is higher than a height of the metal layer 22 within the second area 214, and the metal layer 22 within the first area 213 does not connect with the adjacent metal layer 22 within the first area 214.

In step S13: conducting the DIW stripping process to peel off the transfer layer and the first metal layer within the first area from the substrate, and preserving the metal layer within the second area on the substrate to form the gate of the TFT.

In one example, a structure obtained from the step S12 is placed in a stripping solution. The stripping material of the stripping solution has chemical reaction with the transfer layer 212. After the reaction, the compound is extracted from the substrate 20 and form a complex with the stripping solution. The transfer layer 212 is peeled off from the substrate 20. However, the stripping solution may not interact with the metal layer 22 and the substrate 20, the metal layer 22 and the substrate 20 may not be damaged.

A heating process may be conducted on the stripping solution to facilitate the chemical reaction of the stripping process. In one example, the heat temperature may be in a range of 80 to 90 degree. The heating process may be performed via a stainless steel sink having a heating (temperature control) function.

During the stripping process, the DIW process is conducted to remove ion substance on the metal layer 22 within the second area 214, so as to improve the electrical performance of the TFT. Therefore, the preserved metal layer 22 within the second area 214 may form the gate 23 of the TFT.

In view of the above, the process of forming the gate 23 via the transfer layer 212 having the predetermined pattern may obtain the gate 23 without an etching process. As such the copper ion aggregation in etching solution during the etch process in a conventional manufacturing process of forming the metal electrode may be avoided, so as to reduce risk of overheating and explosion, and may improve the TFT electrical performance The etching solution, the transfer stripper solution in the pattern, and the waste disposal of both solution may be omitted to reduce the costs.

In step S14: forming a gate insulation layer on the gate.

Refer to FIG. 2, a chemical vapor deposition (CVD) process is conducted to form the gate insulation layer 24 on the gate 23, wherein the gate insulation layer 24 covers the whole surface of the substrate 20. In one example, the gate insulation layer 24 may be made of silicon oxide (SiOx). In another example, the gate insulation layer 24 may include a silicon oxide layer and a silicon nitride compound layer in sequence, such as SiO2 (silicon dioxide) and Si3N4 (silicon nitride), to further improve a wear resistance and insulation properties of the gate insulating layer 24.

In step S15: forming a semiconductor layer on a top of the gate within the gate insulation layer.

The PVD process is conducted to the amorphous oxide semiconductor layer, wherein the amorphous oxide semiconductor layer covers the whole surface of the substrate 20. The amorphous oxide semiconductor layer is made of Indium Gallium Zinc Oxide (IGZO), but not limited to, and the semiconductor layer 25 is formed via an annealing process, a coating photoresist process, an exposure process, and the etching process.

In step S16: forming the source and the drain on the gate insulation layer. Wherein the source connects with a source contact area of the semiconductor layer, and the drain connects with a drain contact area of the semiconductor layer.

The PVD process and the patterned process, such as the coating photoresist process, the exposure process, and the etching process are conducted to form the source 261 and the drain 262. The source 261 and the drain 262 are respectively configured on both sides of the semiconductor layer 25. The source 261 connects with the source contact area of the semiconductor layer 25, and the drain 262 connects with the drain contact area of the semiconductor layer 25.

Figure 3:
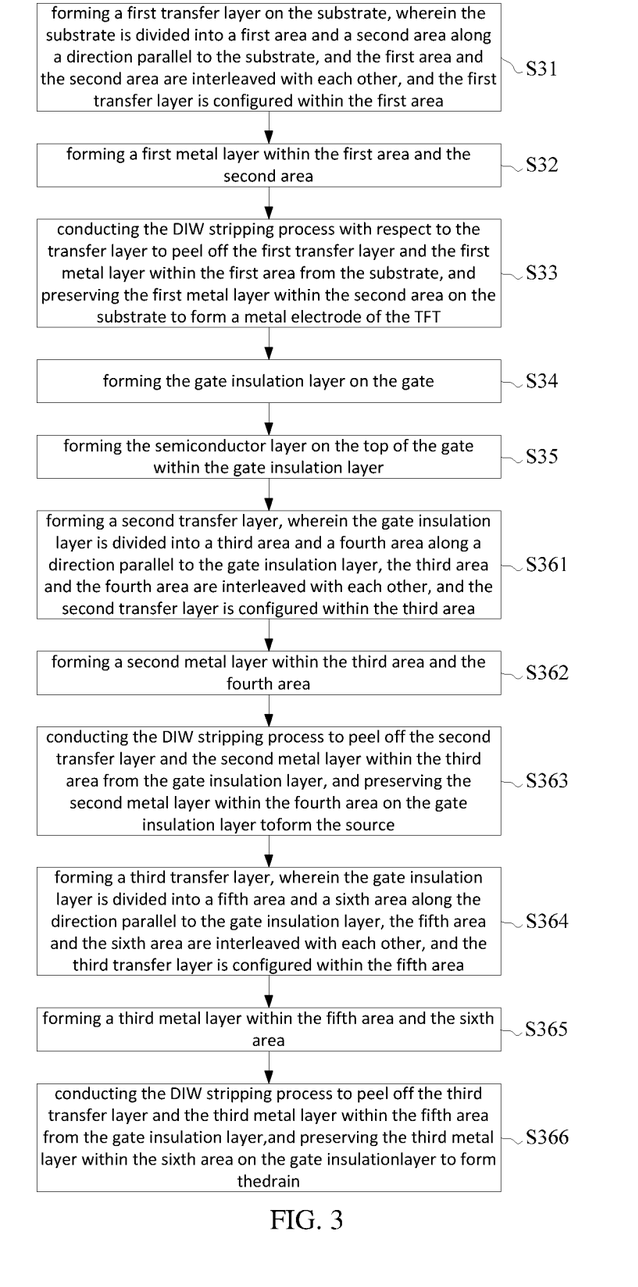
FIG. 3 is a flowchart of a manufacturing method of TFTs in accordance of the second embodiment of the present disclosure.

In one example, the source and the drain of the TFT may be manufactured via the manufacturing process of the gate 23 as described from step S11 to step S13. As shown in FIG. 3, a manufacturing method of TFTs in the present disclosure may include the following steps.

In step S31: forming a first transfer layer on the substrate, wherein the substrate is divided into a first area and a second area along a direction parallel to the substrate, and the first area and the second area are interleaved with each other, and the first transfer layer is configured within the first area.

In step S32: forming a first metal layer within the first area and the second area.

In step S33: conducting the DIW stripping process with respect to the transfer layer to peel off the first transfer layer and the first metal layer within the first area from the substrate, and preserving the first metal layer within the second area on the substrate to form a metal electrode of the TFT.

In step S34: forming the gate insulation layer on the gate.

In step S35: forming the semiconductor layer on the top of the gate within the gate insulation layer.

The detail description of the step S31 to the step S35 may be referred to the step S11 to the step S15, and may not be described again. For the same structural elements in both embodiments, the present disclosure is identified by the same reference numerals. In one example, the metal layer 22 of the gate 23 may be consider to be as the first metal layer, and the transfer layer 212 may be consider to be as the first transfer layer.

In step S361: forming a second transfer layer, wherein the gate insulation layer is divided into a third area and a fourth area along a direction parallel to the gate insulation layer, the third area and the fourth area are interleaved with each other, and the second transfer layer is configured within the third area.

Figure 4:
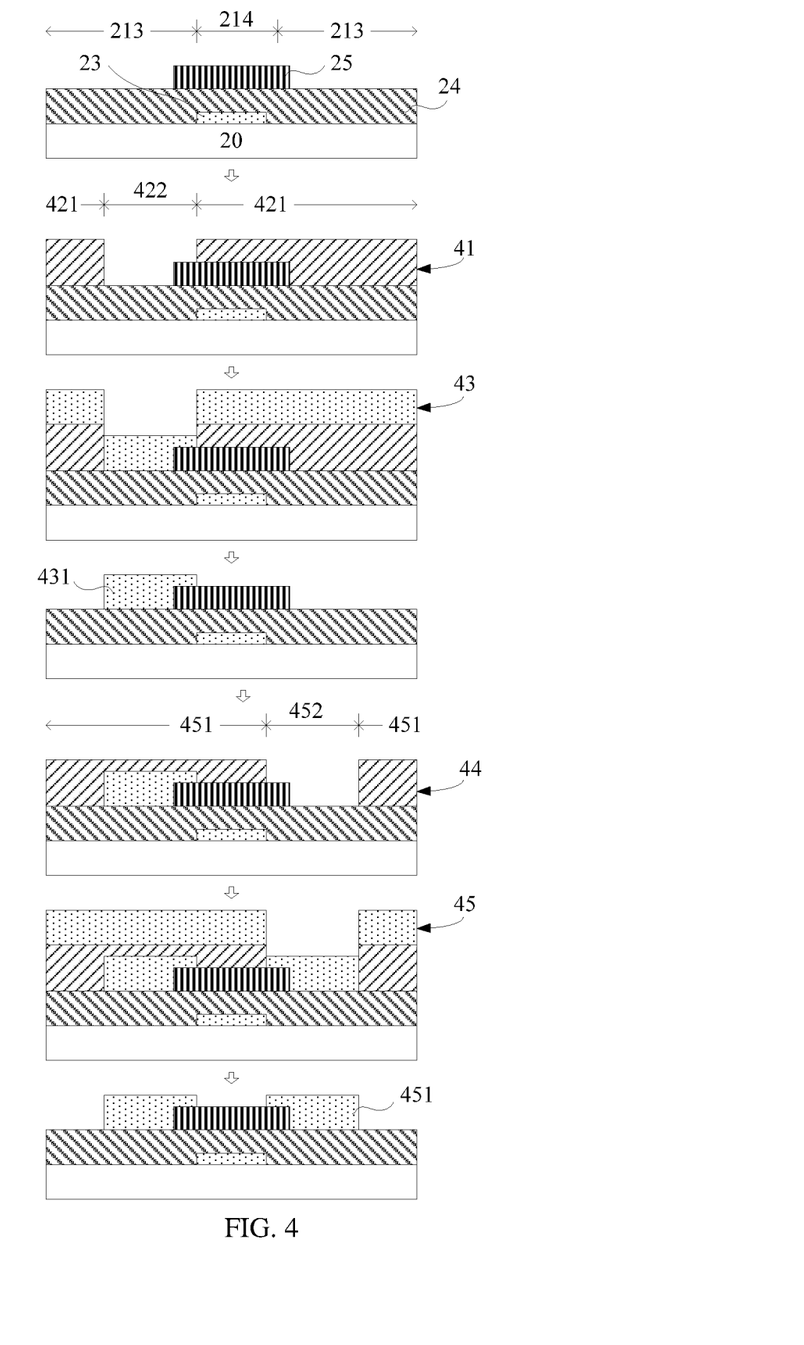
FIG. 4 is a schematic view of the TFT manufactured by the manufacturing method shown in FIG. 2.

In one example, the Nano-imprinting process is adopted on the gate insulation layer 24 and the semiconductor layer 25 to form a second transfer layer 41 having the predetermined pattern. In another example, the attaching process may be adopted to form the second transfer layer 41 on the gate insulation layer 24 and the semiconductor layer 25.

Wherein the fourth area 422 is configured to define a location of the source of the TFT, and the third area 421 is an area outside of the fourth area 422.

In step S362: forming a second metal layer within the third area and the fourth area.

In one example, the PVD process is conducted on the second transfer layer 41 to form the second metal layer 43. The second metal layer 43 may be made of cooper or molybdenum, but not limited to. The second metal layer 43 of the third area 421 is configured within the second transfer layer 41. The second metal layer 43 of the fourth area 422 is configured within the gate insulation layer 24 and a portion of the semiconductor layer 25. A height of the second metal layer 43 within the third area 421 is higher than a height of the second metal layer 43 within the fourth area 422, and the second metal layer 43 within the third area 421 does not connect with the adjacent second metal layer 43 within the fourth area 422.

In step S363: conducting the DIW stripping process to peel off the second transfer layer and the second metal layer within the third area from the gate insulation layer, and preserving the second metal layer within the fourth area on the gate insulation layer to form the source.

In view of the above, the process of forming the source 431 via the second transfer layer 41 having the predetermined pattern may obtain the source 431 without the etching process. As such the copper ion aggregation in etching solution during the etch process in a conventional manufacturing process of forming the metal electrode may be avoided, so as to reduce risk of overheating and explosion, and may improve the TFT electrical performance The etching solution, the transfer stripper solution in the pattern, and the waste disposal of both solution may be omitted to reduce the costs.

In addition, if the etching process is conducted to form the source 431, an etching mask layer needs to be formed within the area of the source 431. The present disclosure may omit the etching mask layer, such that the manufacturing process may be simplified and the efficiency may be improved. The damage of the semiconductor layer 25 caused by the etching solution may be avoided in the present disclosure, so as to further improve the electrical performance of the TFT.

In step S364: forming a third transfer layer, wherein the gate insulation layer is divided into a fifth area and a sixth area along the direction parallel to the gate insulation layer, the fifth area and the sixth area are interleaved with each other, and the third transfer layer is configured within the fifth area.

Wherein the Nano-imprinting process is adopted to form the third transfer layer 44.

In step S365: forming a third metal layer within the fifth area and the sixth area.

In one example, the PVD process is conducted on the third transfer layer 45 to form the third metal layer 45. The third metal layer 45 may be made of cooper or molybdenum, but not limited to. The third metal layer 45 of the fifth area 451 is configured within the third transfer layer 44. The third metal layer 45 of the sixth area 452 is configured within the gate insulation layer 24 and the portion of the semiconductor layer 25. A height of the third metal layer 45 within the fifth area 451 is higher than a height of the third metal layer 45 within the sixth area 452, and the third metal layer 45 within the fifth area 451 does not connect with the adjacent third metal layer 45 within the sixth area 452.

In step S366: conducting the DIW stripping process to peel off the third transfer layer and the third metal layer within the fifth area from the gate insulation layer, and preserving the third metal layer within the sixth area on the gate insulation layer to form the drain.

In view of the above, the process of forming the drain 451 via the third transfer layer 44 having the predetermined pattern may obtain the drain 451 without the etching process. As such the copper ion aggregation in etching solution during the etch process in a conventional manufacturing process of forming the metal electrode may be avoided, so as to reduce risk of overheating and explosion, and may improve the TFT electrical performance The etching solution, the transfer stripper solution in the pattern, and the waste disposal of both solution may be omitted to reduce the costs.

In addition, if the etching process is conducted to form the drain 451, the etching mask layer needs to be formed within the area of the drain 451. The present disclosure may omit the etching mask layer, such that the manufacturing process may be simplified and the efficiency may be improved. The damage of the semiconductor layer 25 caused by the etching solution may be avoided in the present disclosure, so as to further improve the electrical performance of the TFT.

Figure 5:
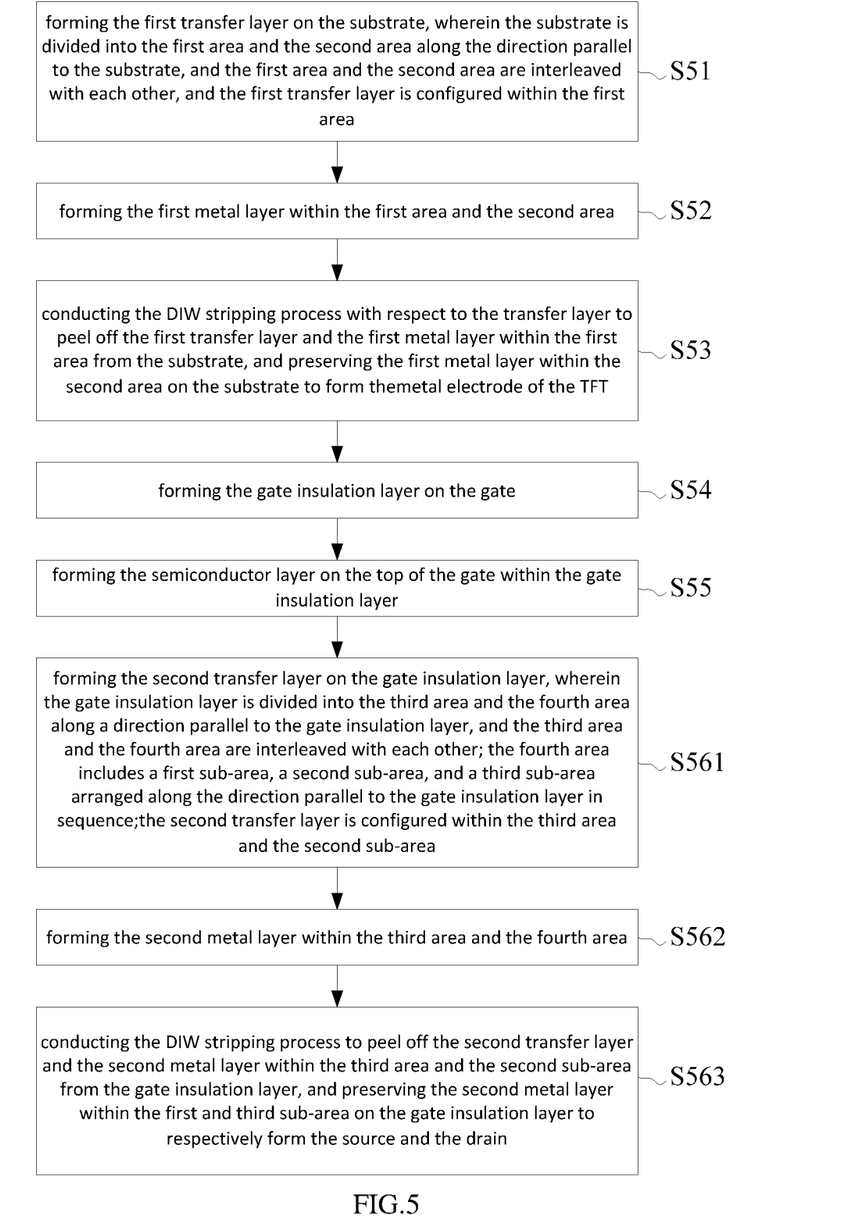
FIG. 5 is a flowchart of a manufacturing method of TFTs in accordance of the third embodiment of the present disclosure.

FIG. 5 is a flowchart of a manufacturing method of TFTs in accordance of one embodiment of the present disclosure. The difference between this embodiment and the embodiment described above resides in that this embodiment may obtain the source and the drain of the TFT via one transfer layer. As shown in FIG. 5, the manufacturing method includes the following steps.

In step S51: forming the first transfer layer on the substrate, wherein the substrate is divided into the first area and the second area along the direction parallel to the substrate, and the first area and the second area are interleaved with each other, and the first transfer layer is configured within the first area.

In step S52: forming the first metal layer within the first area and the second area.

In step S53: conducting the DIW stripping process with respect to the transfer layer to peel off the first transfer layer and the first metal layer within the first area from the substrate, and preserving the first metal layer within the second area on the substrate to form the metal electrode of the TFT.

In step S54: forming the gate insulation layer on the gate.

In step S55: forming the semiconductor layer on the top of the gate within the gate insulation layer.

The detail description of the step S51 to the step S55 may be referred to the step S11 to the step S15, and may not be described again. For the same structural elements in both embodiments, the present disclosure is identified by the same reference numerals. In one example, the metal layer 22 of the gate 23 may be consider to be as the first metal layer, and the transfer layer 212 may be consider to be as the first transfer layer.

In step S561: forming the second transfer layer on the gate insulation layer, wherein the gate insulation layer is divided into the third area and the fourth area along a direction parallel to the gate insulation layer, and the third area and the fourth area are interleaved with each other; the fourth area includes a first sub-area, a second sub-area, and a third sub-area arranged along the direction parallel to the gate insulation layer in sequence; the second transfer layer is configured within the third area and the second sub-area.

Figure 6:
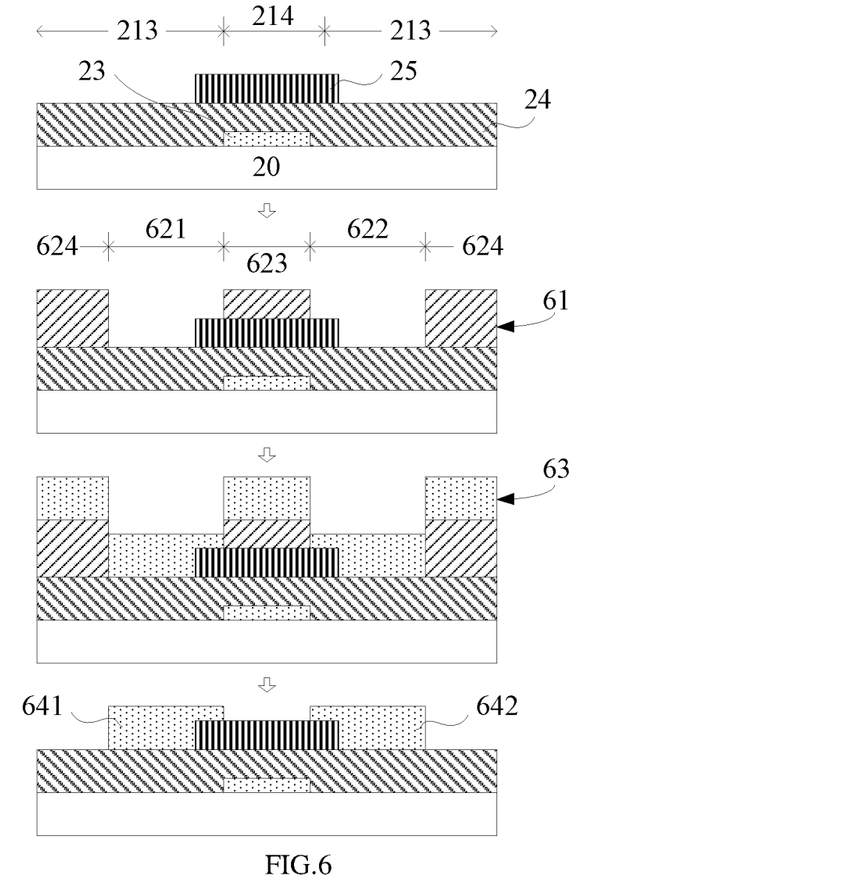
FIG. 6 is a schematic view of the TFT manufactured by the manufacturing method shown in FIG. 5.

In one example, the Nano-imprinting process is adopted on the gate insulation layer 24 and the semiconductor layer 25 to form the second transfer layer 61 having the predetermined pattern. In another example, the attaching process may be adopted to form the second transfer layer 61 on the gate insulation layer 24 and the semiconductor layer 25.

Wherein the first sub-area 621 is configured to define the location of the source of the TFT, the third sub-area 623 is configured to define a location of the drain of the TFT, the second sub-area is configured to define a channel area between the source and the drain, and the third are 624 is the area outside of the fourth area.

In step S562: forming the second metal layer within the third area and the fourth area.

Wherein the second metal layer 63 covers the gate insulation layer 24, the semiconductor layer, and the whole surface of the second transfer layer 61.

In step S563: conducting the DIW stripping process to peel off the second transfer layer and the second metal layer within the third area and the second sub-area from the gate insulation layer, and preserving the second metal layer within the first and third sub-area on the gate insulation layer to respectively form the source and the drain.

The present disclosure may obtain the source 641 and the drain 642 via one transfer layer 61, such that the manufacturing process may be simplified, the efficiency may be improved, and reduce the costs.

Figure 7:
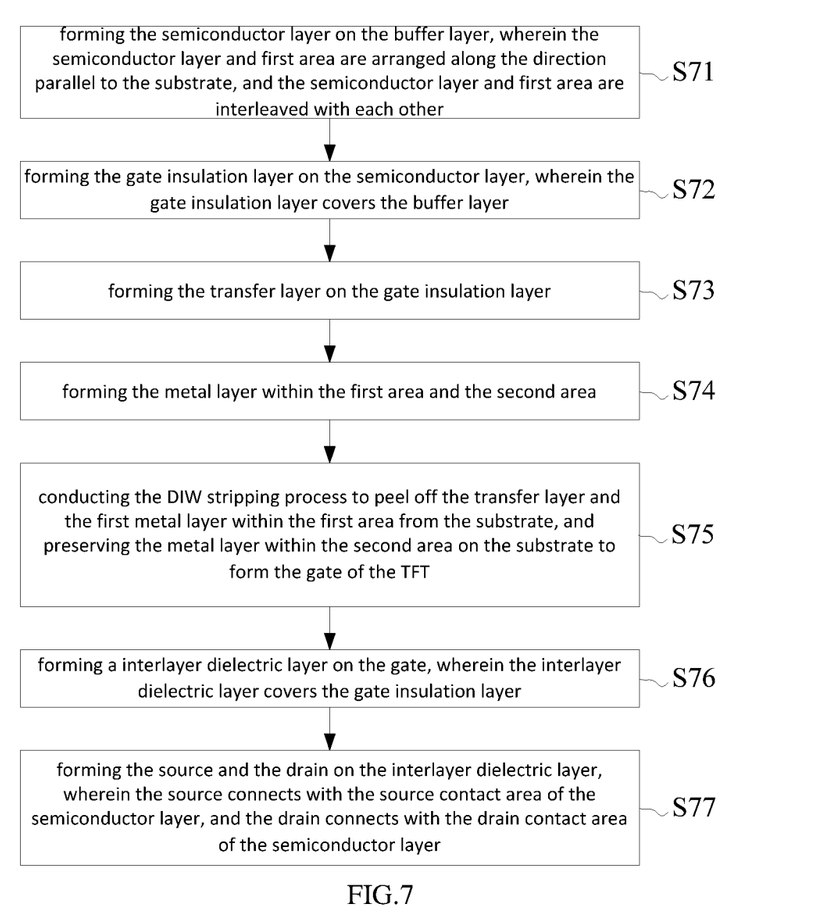
FIG. 7 is a flowchart of a manufacturing method of TFTs in accordance of the fourth embodiment of the present disclosure.

In one example, the present disclosure may be adopted in a bottom gate type TFT shown in FIG. 4 and FIG. 6. In another example, the present disclosure may also be adopted in a top gate type TFT. In the top gate type TFT structure, the substrate further includes a mask layer and a buffer layer, wherein the substrate is divided into the first area and the second area along the direction parallel to the substrate, and the first area and the second area are interleaved with each other. As shown in FIG. 7, the manufacturing method may include the following steps.

In step S71: forming the semiconductor layer on the buffer layer, wherein the semiconductor layer and first area are arranged along the direction parallel to the substrate, and the semiconductor layer and first area are interleaved with each other.

In step S72: forming the gate insulation layer on the semiconductor layer, wherein the gate insulation layer covers the buffer layer.

In step S73: forming the transfer layer on the gate insulation layer.

In step S74: forming the metal layer within the first area and the second area.

In step S75: conducting the DIW stripping process to peel off the transfer layer and the first metal layer within the first area from the substrate, and preserving the metal layer within the second area on the substrate to form the gate of the TFT.

In step S76: forming a media isolation layer on the gate, wherein the media isolation layer covers the gate insulation layer.

In step S77: forming the source and the drain on the media isolation layer, wherein the source connects with the source contact area of the semiconductor layer, and the drain connects with the drain contact area of the semiconductor layer.

In one example, the process of forming the gate of the top gate type TFT may refer to FIG. 2. In another example, the top gate type TFT may be manufactured by the manufacturing method shown in FIG. 4 and FIG. 6.

The present disclosure further relates to a manufacturing method of array substrates. The array substrate may be obtained by either one of the manufacturing method shown from FIG. 1 to FIG. 7. For example. The manufacturing method of array substrates may include the following steps.

Figure 8:
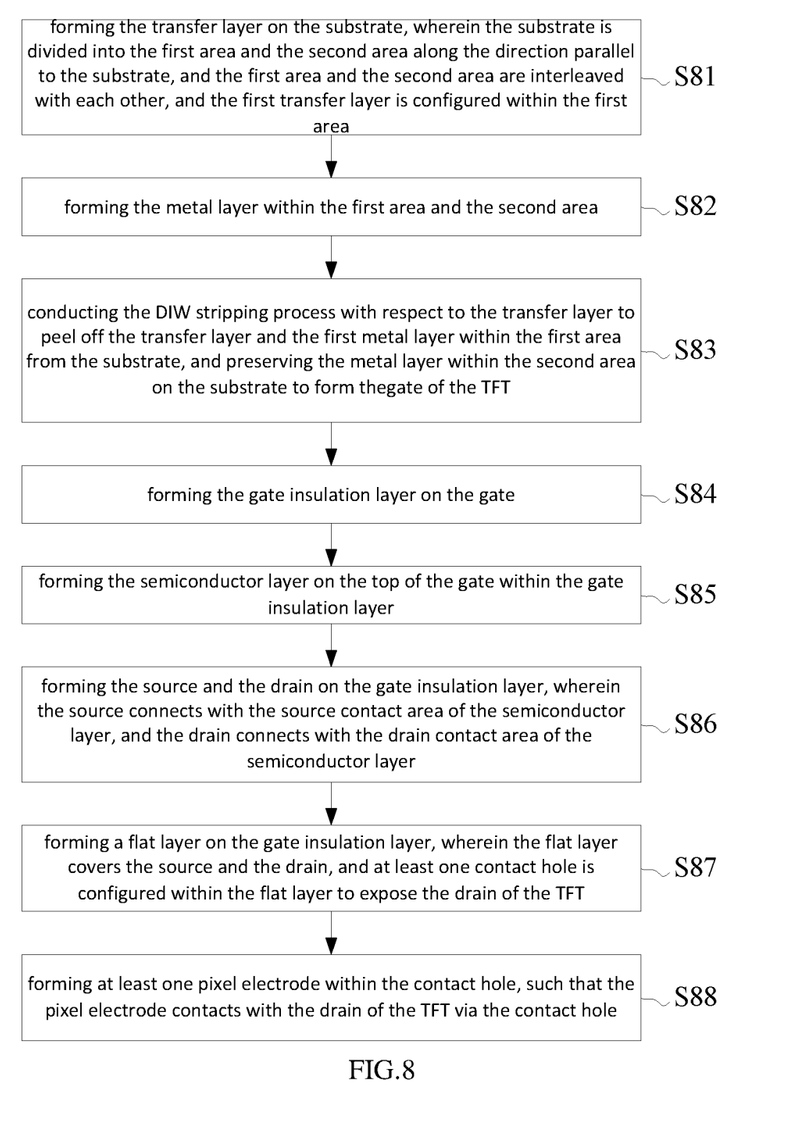
FIG. 8 is a flowchart of a manufacturing method of array substrates in accordance of the first embodiment of the present disclosure.

In step S81: forming the transfer layer on the substrate, wherein the substrate is divided into the first area and the second area along the direction parallel to the substrate, and the first area and the second area are interleaved with each other, and the first transfer layer is configured within the first area.

In step S82: forming the metal layer within the first area and the second area.

In step S83: conducting the DIW stripping process with respect to the transfer layer to peel off the transfer layer and the first metal layer within the first area from the substrate, and preserving the metal layer within the second area on the substrate to form the gate of the TFT.

In step S84: forming the gate insulation layer on the gate.

In step S85: forming the semiconductor layer on the top of the gate within the gate insulation layer.

In step S86: forming the source and the drain on the gate insulation layer, wherein the source connects with the source contact area of the semiconductor layer, and the drain connects with the drain contact area of the semiconductor layer.

In step S87: forming a flat layer on the gate insulation layer, wherein the flat layer covers the source and the drain, and at least one contact hole is configured within the flat layer to expose the drain of the TFT.

In step S88: forming at least one pixel electrode within the contact hole, such that the pixel electrode contacts with the drain of the TFT via the contact hole.

Figure 9:
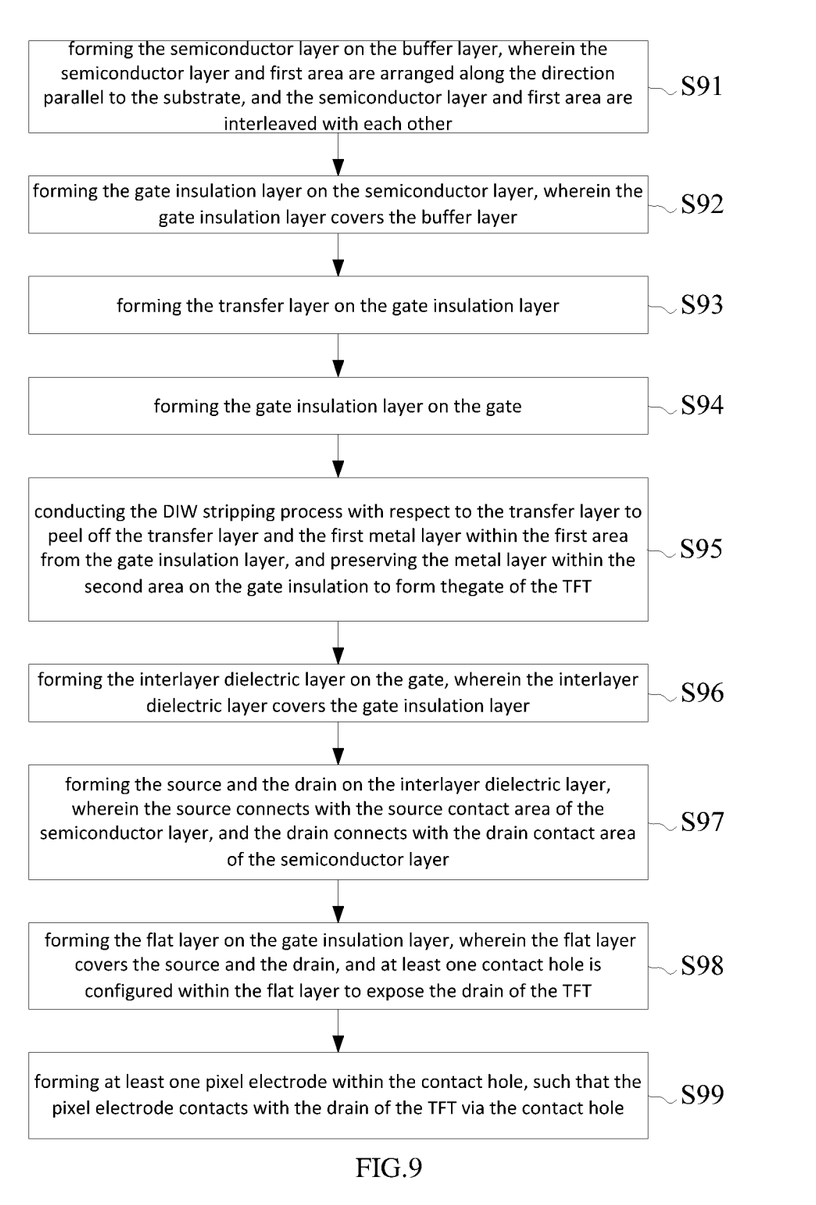
FIG. 9 is a flowchart of a manufacturing method of array substrates in accordance of the second embodiment of the present disclosure.

With respect to the top gate type of TFT, as shown in FIG. 9, the present disclosure may include the following steps.

In step S91: forming the semiconductor layer on the buffer layer, wherein the semiconductor layer and first area are arranged along the direction parallel to the substrate, and the semiconductor layer and first area are interleaved with each other.

In step S92: forming the gate insulation layer on the semiconductor layer, wherein the gate insulation layer covers the buffer layer.

In step S93: forming the transfer layer on the gate insulation layer.

In step S94: forming the gate insulation layer on the gate.

In step S95: conducting the DIW stripping process with respect to the transfer layer to peel off the transfer layer and the first metal layer within the first area from the gate insulation layer, and preserving the metal layer within the second area on the gate insulation to form the gate of the TFT.

In step S96: forming the media isolation layer on the gate, wherein the media isolation layer covers the gate insulation layer.

In step S97: forming the source and the drain on the media isolation layer, wherein the source connects with the source contact area of the semiconductor layer, and the drain connects with the drain contact area of the semiconductor layer.

In step S98: forming the flat layer on the gate insulation layer, wherein the flat layer covers the source and the drain, and at least one contact hole is configured within the flat layer to expose the drain of the TFT.

In step S98: forming at least one pixel electrode within the contact hole, such that the pixel electrode contacts with the drain of the TFT via the contact hole.

The gate, the source, and the drain of the TFT within the array substrate may be manufactured by the manufacturing process described above.

The above description is only the embodiments in the present disclosure, the claim is not limited to the description thereby. The equivalent structure or changing of the process of the content of the description and the figures, or to implement to other technical field directly or indirectly should be included in the claim.

What is claimed is:

1. A manufacturing method of thin film transistors (TFTs), comprising:
    forming a transfer layer on a substrate, wherein the transfer layer covers the whole surface of the substrate;
    conducting a Nano-imprinting process on the whole surface of the transfer layer to form a first transfer layer, wherein the substrate is divided into a first area and a second area along a direction parallel to the substrate, and the first area and the second area are interleaved with each other, and the first transfer layer is configured within the first area;
    forming a first metal layer within the first area and the second area;
    conducting a deionization (DIW) stripping process to peel off the first transfer layer and the first metal layer within the first area from the substrate, and preserving the first metal layer within the second area on the substrate to form a gate of the TFT;
    forming a gate insulation layer on the gate;
    forming a semiconductor layer on a top of the gate within the gate insulation layer;
    forming a second transfer layer, wherein the gate insulation layer is divided into a third area and a fourth area along a direction parallel to the gate insulation layer, and the third area and the fourth area are interleaved with each other; the fourth area comprises a first sub-area, a second sub-area, and a third sub-area arranged along the direction parallel to the gate insulation layer in sequence; the second transfer layer is configured within the third area and the second sub-area;
    forming a second metal layer within the third area and the fourth area;
    conducting the DIW stripping process to peel off the second transfer layer and the second metal layer within the third area and the second sub-area from the gate insulation layer, and preserving the second metal layer within the first and third sub-area on the gate insulation layer to respectively form a source and a drain, wherein the source connects with a source contact area of the semiconductor layer, and the drain connects with a drain contact area of the semiconductor layer.

2. A manufacturing method of TFTs, comprising:
    forming a first transfer layer on a substrate, wherein the substrate is divided into a first area and a second area along a direction parallel to the substrate, and the first area and the second area are interleaved with each other; the first transfer layer is configured within the first area;
    forming a first metal layer within the first area and the second area;
    conducting a DIW stripping process to peel off the first transfer layer and the first metal layer within the first area from the substrate, and preserving the first metal layer within the second area on the substrate to form a gate of the TFT;
    wherein a gate insulation layer is formed on the gate; and
    after forming the gate of the TFT, the manufacturing method further comprises:
        forming a semiconductor layer on a top of the gate within the gate insulation layer;
        forming a source and a drain on the gate insulation layer, wherein the source connects with a source contact area of the semiconductor layer, and the drain connects with a drain contact area of the semiconductor layer; or
    wherein the gate insulation layer is formed on the semiconductor layer and the first transfer layer is formed on the gate insulation layer, the semiconductor layer is formed on a buffer layer, the semiconductor layer and the first area are interleaved with each other along the direction parallel to the substrate, the gate insulation layer covers the buffer layer, a mask layer and the buffer layer are configured on the substrate in sequence, and the mask layer and the first area are interleaved with each other along the direction parallel to the substrate; and after forming the gate of the TFT, the manufacturing method further comprises:

forming a media isolation layer on the gate, wherein the media isolation layer covers the gate insulation layer;

forming the source and the drain on the media isolation layer, wherein the source connects with the source contact area of the semiconductor layer, and the drain connects with the drain contact area of the semiconductor layer.

3. The manufacturing method of TFTs according to claim 2, wherein the step of forming the source and the drain on the gate insulation layer further comprises:

forming a second transfer layer, wherein the gate insulation layer is divided into a third area and a fourth area along a direction parallel to the gate insulation layer, and the third area and the fourth area are interleaved with each other, and the second transfer layer is configured within the third area;

forming a second metal layer within the third area and the fourth area;

conducting the DIW stripping process to peel off the second transfer layer and the second metal layer within the third area from the gate insulation layer, and preserving the second metal layer within the fourth area on the gate insulation layer to form the source;

forming a third transfer layer, wherein the gate insulation layer is divided into a fifth area and a sixth area along the direction parallel to the gate insulation layer, and the fifth area and the sixth area are interleaved with each other; the third transfer layer is configured within the fifth area;

forming a third metal layer within the fifth area and the sixth area;

conducting the DIW stripping process to peel off the third transfer layer and the third metal layer within the fifth area from the gate insulation layer, and preserving the third metal layer within the sixth area on the gate insulation layer to form the drain.

4. The manufacturing method of TFTs according to claim 2, wherein the step of forming the source and the drain on the gate insulation layer further comprises:

forming a second transfer layer, wherein the gate insulation layer is divided into a third area and a fourth area along a direction parallel to the gate insulation layer, and the third area and the fourth area are interleaved with each other; the fourth area comprises a first sub-area, a second sub-area, and a third sub-area arranged along the direction parallel to the gate insulation layer in sequence; the second transfer layer is configured within the third area and the second sub-area;

forming a second metal layer within the third area and the fourth area;

conducting the DIW stripping process to peel off the second transfer layer and the second metal layer within the third area and the second sub-area from the gate insulation layer, and preserving the second metal layer within the first and third sub-area on the gate insulation layer to respectively form the source and the drain.

5. The manufacturing method of TFTs according to claim 2, wherein the step of forming the source and the drain on the media isolation layer further comprises:

forming the second transfer layer on the media isolation layer, wherein the media insulation layer is divided into the third area and the fourth area along a direction parallel to the media isolation layer, and the third area and the fourth area are interleaved with each other, and the second transfer layer is configured within the third area;

forming the second metal layer within the third area and the fourth area;

conducting the DIW stripping process to peel off the second transfer layer and the second metal layer within the third area from the media isolation layer, and preserving the second metal layer within the fourth area on the media isolation layer to form the source;

forming a third transfer layer on the media isolation layer, wherein the media isolation layer is divided into a fifth area and a sixth area along the direction parallel to the media isolation layer, and the fifth area and the sixth area are interleaved with each other, and the third transfer layer is configured within the fifth area;

forming a third metal layer within the fifth area and the sixth area;

conducting the DIW stripping process to peel off the third transfer layer and the third metal layer within the fifth area from the media isolation layer, and preserving the third metal layer within the sixth area on the media isolation layer to form the drain.

6. The manufacturing method of TFTs according to claim 2, wherein the step of forming the source and the drain on the media isolation layer further comprises:

forming the second transfer layer on the media isolation layer, wherein the media insulation layer is divided into the third area and the fourth area along the direction parallel to the media insulation layer, and the third area and the fourth area are interleaved with each other; the fourth area comprises the first sub-area, the second sub-area, and the third sub-area arranged along the direction parallel to the media isolation layer in sequence; the second transfer layer is configured within the third area and the second sub-area;

forming the second metal layer within the third area and the fourth area;

conducting the DIW stripping process to peel off the second transfer layer and the second metal layer within the third area and the second sub-area from the media isolation layer, and preserving the second metal layer within the first area and the third sub-area on the media isolation layer to respectively form the source and the drain.

7. The manufacturing method of TFTs according to claim 2, wherein the step of forming the first transfer layer on the substrate further comprises:

forming the transfer layer on the substrate, wherein the transfer layer covers the whole surface of the substrate;

conducting a Nano-imprinting process on the whole surface of the transfer layer to form the first transfer layer.

8. The manufacturing method of TFTs according to claim 2, wherein an attaching process is adopted to directly adhere the first transfer layer to the substrate.

9. A manufacturing method of array substrates, comprising:

forming a first transfer layer on a substrate, wherein the substrate is divided into a first area and a second area along a direction parallel to the substrate, and the first area and the second area are interleaved with each other; the first transfer layer is configured within the first area;

forming a first metal layer within the first area and the second area;

conducting a DIW stripping process to peel off the first transfer layer and the first metal layer within the first area from the substrate, and preserving the first metal layer within the second area on the substrate to form a gate of the TFT;

wherein a gate insulation layer is formed on the gate; and after forming the gate of the TFT, the manufacturing method further comprises:

forming a semiconductor layer on a top of the gate within the gate insulation layer;

forming a source and a drain on the gate insulation layer, wherein the source connects with a source contact area of the semiconductor layer, and the drain connects with a drain contact area of the semiconductor layer; or wherein the gate insulation layer is formed on the semiconductor layer and the first transfer layer is formed on the gate insulation layer, the semiconductor layer is formed on a buffer layer, the semiconductor layer and the first area are interleaved with each other along the direction parallel to the substrate, the gate insulation layer covers the buffer layer, a mask layer and the buffer layer are configured on the substrate in sequence, and the mask layer and the first area are interleaved with each other along the direction parallel to the substrate; and after forming the gate of the TFT, the manufacturing method further comprises:

forming a media isolation layer on the gate, wherein the media isolation layer covers the gate insulation layer;

forming the source and the drain on the media isolation layer, wherein the source connects with the source contact area of the semiconductor layer, and the drain connects with the drain contact area of the semiconductor layer.

10. The manufacturing method of array substrates according to claim 9, wherein the step of forming the source and the drain on the gate insulation layer further comprises:

forming a second transfer layer, wherein the gate insulation layer is divided into a third area and a fourth area along a direction parallel to the gate insulation layer, and the third area and the fourth area are interleaved with each other, and the second transfer layer is configured within the third area;

forming a second metal layer within the third area and the fourth area;

conducting the DIW stripping process to peel off the second transfer layer and the second metal layer within the third area from the gate insulation layer, and preserving the second metal layer within the fourth area on the gate insulation layer to form the source;

forming a third transfer layer, wherein the gate insulation layer is divided into a fifth area and a sixth area along the direction parallel to the gate insulation layer, and the fifth area and the sixth area are interleaved with each other; the third transfer layer is configured within the fifth area;

forming a third metal layer within the fifth area and the sixth area;

conducting the DIW stripping process to peel off the third transfer layer, the and the third metal layer within the fifth area from the gate insulation layer, and preserving the third metal layer within the sixth area on the gate insulation layer to form the drain.

11. The manufacturing method of array substrates according to claim 9, wherein the step of forming the source and the drain on the gate insulation layer further comprises:

forming a second transfer layer, wherein the gate insulation layer is divided into a third area and a fourth area along a direction parallel to the gate insulation layer, and the third area and the fourth area are interleaved with each other; the fourth area comprises a first sub-area, a second sub-area, and a third sub-area arranged along the direction parallel to the gate insulation layer in sequence; the second transfer layer is configured within the third area and the second sub-area;

forming a second metal layer within the third area and the fourth area;

conducting the DIW stripping process to peel off the second transfer layer and the second metal layer within the third area and the second sub-area from the gate insulation layer, and preserving the second metal layer within the first and third sub-area on the gate insulation layer to form the source and the drain.

12. The manufacturing method of array substrates according to claim 9, wherein the step of forming the source and the drain on the media isolation layer further comprises:

forming the second transfer layer on the media isolation layer, wherein the media insulation layer is divided into the third area and the fourth area along a direction parallel to the media isolation layer, and the third area and the fourth area are interleaved with each other, and the second transfer layer is configured within the third area;

forming the second metal layer within the third area and the fourth area;

conducting the DIW stripping process to peel off the second transfer layer and the second metal layer within the third area from the media isolation layer, and preserving the second metal layer within the fourth area on the media isolation layer to form the source;

forming a third transfer layer on the media isolation layer, wherein the media isolation layer is divided into a fifth area and a sixth area along the direction parallel to the media isolation layer, and the fifth area and the sixth area are interleaved with each other, and the third transfer layer is configured within the fifth area;

forming a third metal layer within the fifth area and the sixth area;

conducting the DIW stripping process to peel off the third transfer layer and the third metal layer within the fifth area from the media isolation layer, and preserving the third metal layer within the sixth area on the media isolation layer to form the drain.

13. The manufacturing method of array substrates according to claim 9, wherein the step of forming the source and the drain on the media isolation layer further comprises:

forming the second transfer layer on the media isolation layer, wherein the media insulation layer is divided into the third area and the fourth area along the direction parallel to the media insulation layer, and the third area and the fourth area are interleaved with each other; the fourth area comprises the first sub-area, the second sub-area, and the third sub-area arranged along the direction parallel to the media isolation layer in sequence; the second transfer layer is configured within the third area and the second sub-area;

forming the second metal layer within the third area and the fourth area;

conducting the DIW stripping process to peel off the second transfer layer and the second metal layer within the third area and the second sub-area from the media isolation layer, and preserving the second metal layer within the first area and the third sub-area on the media isolation layer to respectively form the source and the drain.

14. The manufacturing method of array substrates according to claim 9, wherein the step of forming the first transfer layer on the substrate further comprises:
    forming the transfer layer on the substrate, wherein the transfer layer covers the whole surface of the substrate;
    conducting a Nano-imprinting process on the whole surface of the transfer layer to form the first transfer layer.

15. The manufacturing method of array substrates according to claim 9, wherein an attaching process is adopted to directly adhere the first transfer layer to the substrate.

\* \* \* \* \*